US006888758B1

(12) United States Patent
Hemink et al.

(10) Patent No.: US 6,888,758 B1
(45) Date of Patent: May 3, 2005

(54) PROGRAMMING NON-VOLATILE MEMORY

(75) Inventors: Gertjan Hemink, Yokohama (JP); Yupin Fong, Fremont, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 10/761,620

(22) Filed: Jan. 21, 2004

(51) Int. Cl.[7] .............................................. G11C 16/06
(52) U.S. Cl. ............................ 365/185.22; 365/185.19; 365/185.18
(58) Field of Search ....................... 365/185.22, 185.18, 365/185.19

(56) References Cited

U.S. PATENT DOCUMENTS

| | | |
|---|---|---|
| 5,220,531 A | 6/1993 | Blyth et al. |
| 5,313,421 A | 5/1994 | Guterman et al. |
| 5,412,601 A | 5/1995 | Sawada et al. |
| 5,521,865 A | 5/1996 | Ohuchi et al. |
| 5,570,315 A | 10/1996 | Tanaka et al. |
| 5,652,719 A | 7/1997 | Tanaka et al. |
| 5,712,180 A | 1/1998 | Guterman et al. |
| 5,712,815 A | 1/1998 | Bill et al. |
| 5,761,222 A | 6/1998 | Baldi |
| 5,870,344 A | 2/1999 | Ozawa |
| 5,949,714 A | 9/1999 | Hemink et al. |
| 6,151,248 A | 11/2000 | Harari et al. |
| 6,222,762 B1 | 4/2001 | Guterman et al. |
| 6,266,270 B1 | 7/2001 | Nobukata |
| 6,301,161 B1 | 10/2001 | Holzmann et al. |
| 6,317,364 B1 | 11/2001 | Guterman et al. |
| 6,424,566 B1 | 7/2002 | Parker |
| 6,519,184 B2 * | 2/2003 | Tanaka et al. ......... 365/185.18 |
| 6,522,580 B2 | 2/2003 | Chen et al. |
| 6,525,964 B2 | 2/2003 | Tanaka et al. |
| 6,529,412 B1 | 3/2003 | Chen et al. |
| 6,532,172 B2 | 3/2003 | Harari et al. |
| 6,590,811 B1 * | 7/2003 | Hamilton et al. ...... 365/185.22 |
| 2002/0118574 A1 | 8/2002 | Gongwer et al. |
| 2003/0147278 A1 | 8/2003 | Tanaka et al. |

OTHER PUBLICATIONS

Kurata, Hideaki, et al., Constant–Charge–Injection Programming for 10–MB/s Multilevel AG–AND Flash Memories, 2002 Symposium On VLSI Circuits Digest of Technical Papers, pp. 302–303.

Johnson, William S., et al., Session XII: ROMs, PROMs and EROMs, 1980 IEEE International Solid State Circuits Conference, pp. 152–153.

Nobukata, Hiromi, et al., A 144Mb 8–Level NAND Flash Memory with Optimized Pulse Width Programming, 1999 Symposium on VLSI Circuits Digest of Technical Papers, pp. 39–40.

Ohkawa, Masayoshi, et al., TP 2.3: A 98 mm2 3.3V 64Mb Flash Memory with FN–NOR Type 4–level Cell, 1996 IEEE International Solid–State Circuits Conference, pp. 36–37.

* cited by examiner

Primary Examiner—Huan Hoang
(74) Attorney, Agent, or Firm—Vierra Magen Marcus Harmon & DeNiro LLP

(57) ABSTRACT

One or more programming operations are performed on a set of non-volatile storage elements. For example, the programming operations may include applying a set of programming pulses. A verify process is performed to determine which of the non-volatile storage element have reached an intermediate verify threshold but have not reached a final verify threshold. One additional programming operation at a reduced level is performed for the non-volatile storage elements that have reached the intermediate verify threshold but have not reached the final verify threshold, and those non-volatile storage elements are then inhibited from further programming. Non-volatile storage elements that have not reached the intermediate verify threshold continue programming. Non-volatile storage elements that reach the final verify threshold are inhibited from programming.

35 Claims, 12 Drawing Sheets

PROGRAMMING NON-VOLATILE MEMORY

BACKGROUND OF THE INVENTION

1. Field of the Invention

The present invention relates generally to technology for programming memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above and insulated from a channel region in a semiconductor substrate. The channel region is positioned in a p-well between source and drain regions. A control gate is provided over and insulated from the floating gate. The threshold voltage of the memory cell is controlled by the amount of charge that is retained on the floating gate. That is, the level of charge on the floating gate determines the minimum amount of voltage that must be applied to the control gate before the memory cell is turned on to permit conduction between its source and drain.

Some EEPROM and flash memory devices have a floating gate that is used to store two ranges of charges and, therefore, the memory cell can be programmed/erased between two states. A multi-bit or multi-state flash memory cell is implemented by identifying multiple, distinct threshold voltage ranges within a device. Each distinct threshold voltage range corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. To achieve proper data storage for a multi-state cell, the multiple ranges of threshold voltage levels of the multi-state memory cell should be separated from each other by sufficient margin so that the level of the memory cell can be programmed or erased in an unambiguous manner.

When programming an EEPROM or flash memory device, a program voltage is applied to the control gate and the bit line is grounded. Electrons from the channel are injected into the floating gate. When electrons accumulate in the floating gate, the floating gate becomes negatively charged and the threshold voltage of the memory cell is raised.

Typically, the program voltage Vpgm applied to the control gate is applied as a series of pulses, as depicted in FIG. 1. The magnitude of the pulses is increased with each successive pulse by a predetermined step size (e.g. 0.2 v). In the periods between the pulses, verify operations are carried out. That is, the programming level of each cell of a group of cells being programmed in parallel is read between each programming pulse to determine whether it is equal to or greater than a verify level to which it is being programmed. One means of verifying the programming is to test conduction at a specific compare point. The cells that are verified to be sufficiently programmed are locked out, for example, by raising the bit line voltage from 0 to Vdd to stop the programming process for those cells. For example, FIG. 2 depicts graphs of threshold voltage (Vth) versus time and bit line voltage (Vbl) versus time. While the memory cell is receiving the program voltage Vpgm of FIG. 1, the threshold voltage of the memory cell increases. When the threshold voltage of the memory cell reaches the verify level (e.g. Vver1), then the bit line voltage is raised to Vinhibit (e.g. Vdd). The above described techniques, and others described herein, can be used in combination with various self boosting techniques, for example, as described in U.S. patent application Ser. No. 10/379,608, titled "Self Boosting Technique," filed on Mar. 5, 2003, incorporated herein by reference in its entirety. Additionally, an efficient verify technique can be used, such as described in U.S. patent application Ser. No. 10/314,055, "Smart Verify for Multi-State Memories," filed Dec. 5, 2002, incorporated herein by reference in its entirety.

When programming as depicted in FIG. 2, there is a tradeoff between speed of programming and precision of programming. The precision of programming is related to the distribution of threshold voltages of the programmed memory cells subsequent to the programming process. The tighter the threshold voltage distribution, the easier it is to unambiguously read the memory cells. The need for tight threshold voltage distributions is even more important with multi-state memory cells because the read process needs to unambiguously distinguish between the different threshold voltage distributions. To obtain a tight threshold voltage distribution, a smaller step size is used for the program voltage Vpgm. However, using a smaller step size slows down the programming process.

An improvement to the traditional programming process is depicted in FIG. 3. The process of FIG. 3 applies the program voltage signal Vpgm of FIG. 1 to the control gates of the memory cells to be programmed. Between the program pulses, verify operations are performed. If the threshold voltage of the memory cell being programmed is less than Vver2, the programming continues for that cell with the bit line voltage remaining low (e.g. 0 volts). If the threshold voltage of the memory cell being programmed is higher than Vver2 and lower than Vver1, then an intermediate bit line voltage (e.g. 1 volt) is applied. As a result of the intermediate bit line voltage, the channel voltage will increase (e.g. 1 volt) and the programming of that memory cell will be slowed down because the shift in threshold voltage due to each program pulse will be reduced. The bit line will remain at the intermediate bit line voltage for a number of pulses until the threshold voltage of the memory cell reaches the final target, Vver1. When the memory cell's threshold voltage reaches Vver1, the bit line will be raised to inhibit further programming (e.g. by raising the bit line voltage to Vinhibit (e.g. Vdd)).

Using the approach of FIG. 3 results in the programmed threshold voltage distribution being narrower than the process of FIG. 2 because the shift per pulse of the threshold voltage is reduced once the threshold voltage is close to the target value (e.g. when the threshold voltage is above Vvere2 and below Vver1). However, the speed of the programming process of FIG. 3 could be improved because multiple additional pulses (e.g. typically, 2 to 3 pulses) may be needed to finish the programming process since the intermediate bit line bias slows down the programming of the memory cells.

Another issue with prior memory systems relates to power. Many previous systems use a Vdd of 3 volts. It is advantageous to use a lower Vdd because a lower Vdd allows the memory system to use less power. If the memory system uses less power, the host device (e.g. digital camera) will have a longer battery life. If Vdd is reduced (e.g. to 1.8 volts), the memory cells may not be able to use an intermediate bit line voltage of 1 volt. For example, in a NAND chain with a select gate transistor (see discussion below), if the lower Vdd (e.g. 1.8 volts) is applied to the gate of the select gate transistor to turn on the select gate transistor, then the 1V bit line voltage may not be fully transferred to the source side of the select transistor. The voltage that can be transferred to the source side depends on the threshold voltage of the select gate transistor. If for example, the select gate has a threshold voltage of 1.2V, then the voltage at the source side of the select gate will only reach a value of 0.6V–1.8V (gate voltage)–1.2V (threshold voltage). It is possible to transfer 1V to the source side by lowering the threshold voltage of the select gate transistor; however, then the leakage of that transistor will increase in the case when the select gate is turned off (0V at the select gate). Another solution would be to increase the gate voltage of the select gate to for example 2.4V, however, in that case, during programming, leakage from the channel region towards the bit line may occur during a so called self-boosting operation when 1.8V is applied to the bit line and the channel area under the selected NAND string is boosted to a high voltage.

SUMMARY OF THE INVENTION

The present invention, roughly described, pertains to technology for programming a memory device. More specifically, the present invention provides for a programming process that is faster and results in a tighter threshold voltage distribution. In some embodiments, the improved programming process uses a lower intermediate bit line voltage, thereby allowing a lower Vdd to be used.

One embodiment of the present invention includes performing one or more programming operations on a non-volatile storage element, determining that the non-volatile storage element has reached an intermediate verify threshold, performing only one additional programming operation at a reduced level on the non-volatile storage element in response to the step of determining, and inhibiting programming of the non-volatile storage element after performing the additional programming operation regardless of change to the non-volatile storage element in response to the one additional programming operation. In one example implementation, the programming process includes the application of a set of pulses that increase in magnitude over time to the control gates of memory cells being programmed, with each programming operation referred to above including the application of one pulse. In other embodiments, a programming operation can include an act other than the application of a pulse, as appropriate for the particular memory technology. For example, program signals other than pulses can be used, including signals that increase (with or without a fixed increment size) or do not increase.

Another embodiment of the present invention includes performing programming operations on a non-volatile storage element where the programming operations include an increasing program voltage with an increment size, determining that the non-volatile storage element has reached a particular intermediate verify threshold of a set of intermediate verify thresholds, performing one additional programming operation on the non-volatile storage element in response to the step of determining, and inhibiting programming of the non-volatile storage element after performing the one additional programming operation regardless of change to the non-volatile storage element in response to the one additional programming operation. The one additional programming operation changes a threshold voltage of the non-volatile storage element by a fraction of the increment size wherein the size of the fraction depends on which of the intermediate verify thresholds had been determined to be reached.

In some embodiments, there can be more than one (e.g. two, three or more) intermediate thresholds.

One example implementation includes an array of non-volatile storage elements and a control circuit in communication with the non-volatile storage elements. The control circuit causes the non-volatile storage elements to perform one or more programming operations, determines which of the non-volatile storage element reached an intermediate verify threshold but have not reached a final verify threshold, causes one additional programming operation at a reduced level to be performed on the non-volatile storage elements that have reached the intermediate verify threshold but have not reached the final verify threshold, automatically inhibits programming for the non-volatile storage elements that have reached the intermediate verify threshold after the one additional programming operation and continues programming for non-volatile storage elements that have not reached the intermediate verify threshold.

Another embodiment of the present invention includes creating an array of non-volatile storage elements, setting a final verify threshold for a programming process and setting an intermediate verify threshold for the programming process so that after a set of one or more non-volatile storage elements reach the intermediate verify threshold one programming operation will cause the set of one or more non-volatile storage elements to reach the final verify threshold.

These and other objects and advantages of the present invention will appear more clearly from the following description in which the preferred embodiment of the invention has been set forth in conjunction with the drawings.

DETAILED DESCRIPTION

Figure 4:
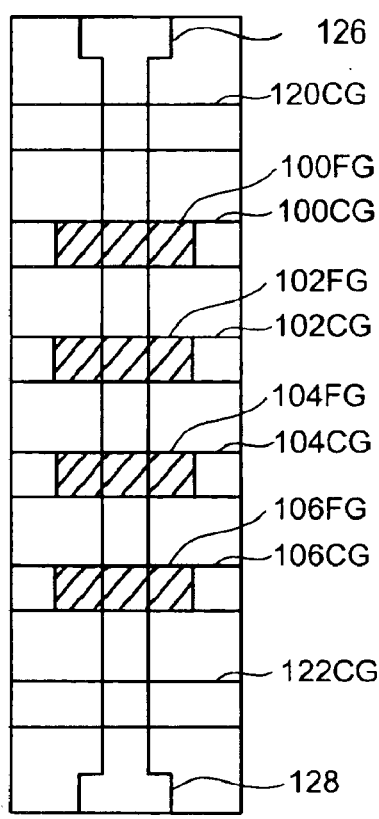
FIG. 4 is a top view of a NAND string.
Figure 5:
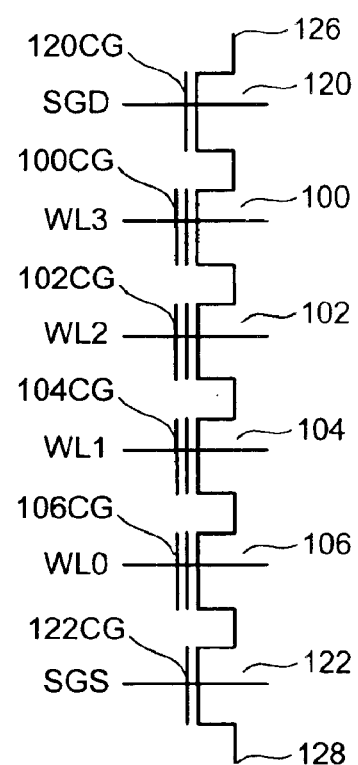
FIG. 5 is an equivalent circuit diagram of the NAND string.

One example of a flash memory system suitable for implementing the present invention uses the NAND structure, which includes arranging multiple transistors in series between two select gates. The transistors in series and the select gates are referred to as a NAND string. FIG. 4 is a top view showing one NAND string. FIG. 5 is an equivalent circuit thereof. The NAND string depicted in FIGS. 4 and 5 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 4 and 5.

Figure 6:
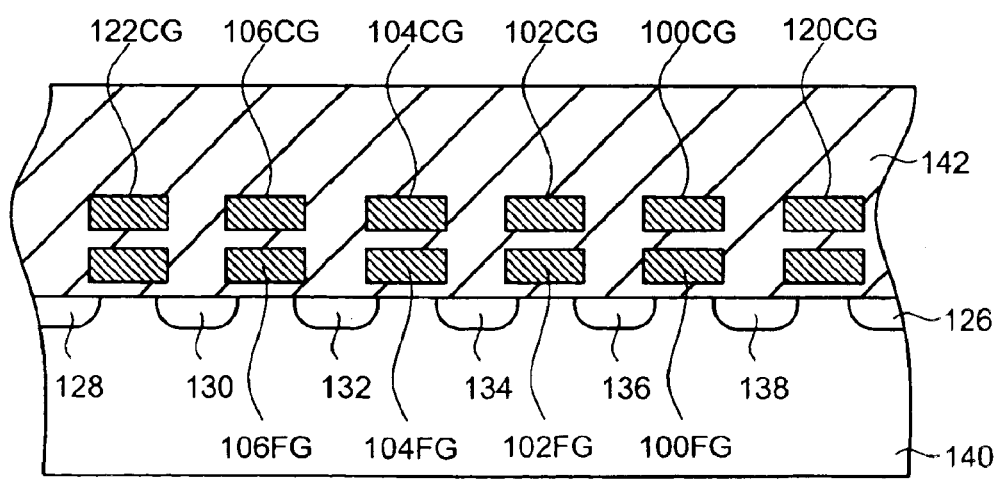
FIG. 6 is a cross sectional view of the NAND string.

FIG. 6 provides a cross-sectional view of the NAND string described above. As depicted in FIG. 6, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an inter-polysilicon dielectric layer separating the control gate and floating gate. Note that FIG. 6 appears to depict a control gate and floating gate for transistors 120 and 122. However, for transistors 120 and 122, the control gate and the floating gate are connected together. In other embodiments, the gate traditionally thought of as the floating gate is connected, while gate on top of that is not connected. The control gates of the memory cells (100, 102, 104, 106) form the word lines. N+ diffused layers 130, 132, 134, 136 and 138 are shared between neighboring cells, whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 4–6 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, thereby storing multiple bits of digital data. In the case of storing multiple levels of data, the range of possible threshold voltages is divided into the number of storage levels. For example, if four levels of information is stored, there will be four threshold voltage ranges assigned to the data values "11", "10", "01,", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528 and U.S. patent application Ser. No. 09/893,277 (Publication No. US2003/0002348). Information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety. Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

Figure 7:
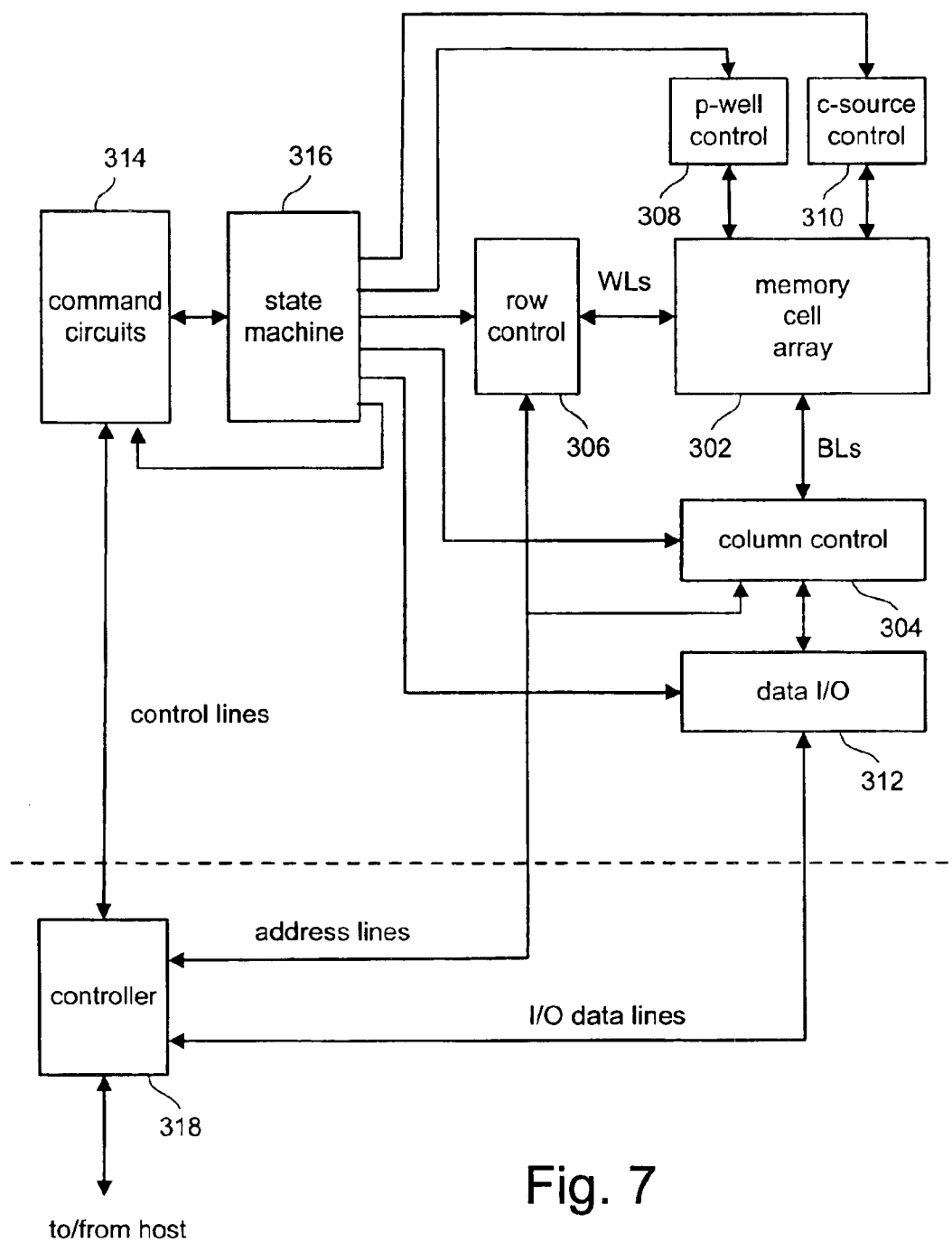
FIG. 7 is a block diagram of one embodiment of a non-volatile memory system in which the various aspects of the present invention are implemented.

FIG. 7 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 8) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller can be embedded in the host or included within a removable memory system.

In some implementations, some of the components of FIG. 7 can be combined. In various designs, all or some of the components of FIG. 7, other than memory cell array 302, can be thought of as control circuits or a control circuit.

Figure 8:
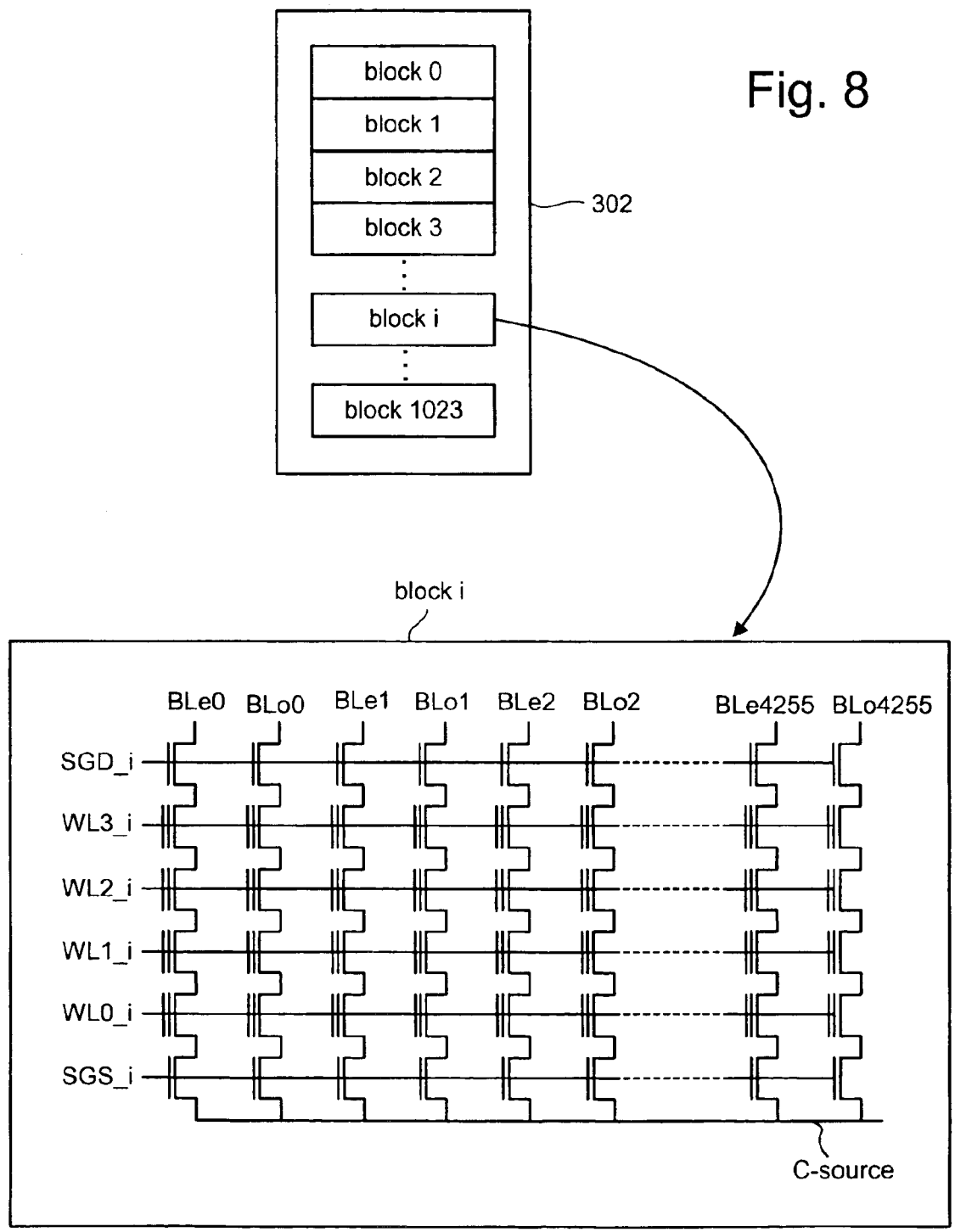
FIG. 8 illustrates an example of an organization of a memory array.

With reference to FIG. 8, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 8 shows four memory cells connected in series to form a NAND string. Although four cells are shown to be included in each NAND string, more or less than four memory cells can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 logical pages. Other sized blocks and pages can also be used with the present invention. Additionally, architectures other than that of FIGS. 7 and 8 can also be used to implement the present invention.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g. WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. In a verify operation for a two level memory cell, the selected word line WL2 is connected to 0.8V, for example, so that it is verified whether the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell (M). The state of the memory cell is, thereby, detected by a sense amplifier that is connected to the bit line.

The erase, read and verify operations described above are performed according to techniques known in the art. Thus, many of the details explained can be varied by one skilled in the art. Other read and verify techniques known in the art can also be used.

Figure 9:
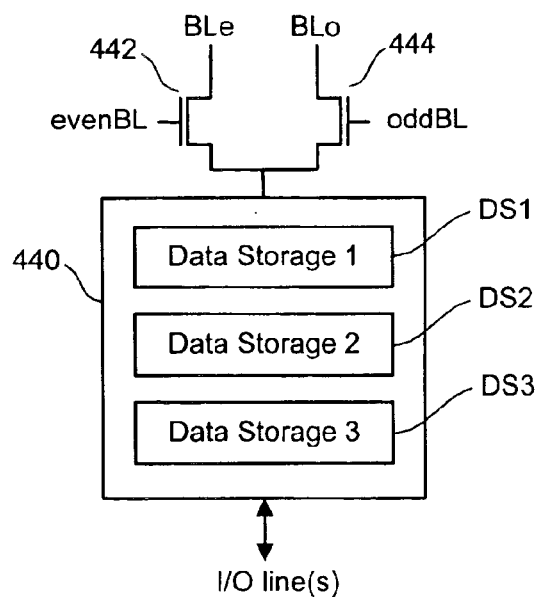
FIG. 9 depicts a portion of the column control circuit.

FIG. 9 is a schematic block diagram of a portion of column control circuit 304 of FIG. 7. In column control circuit 304, a data storage circuit 440 is arranged for every two bit lines, including an even numbered BLe and an odd numbered bit line BLo. In the column control circuit 304, a sense amplifier is also arranged for data storage circuit 440 in order to write data into and read data from memory cells.

An n-channel MOS transistor 442 is connected for column selection between data storage circuit 440 and even numbered bit line BLe. Another n-channel MOS transistor 444 is connected for column selection between data storage circuit 440 and odd numbered bit line BLo. Either of the even numbered bit line BLe or the odd numbered bit line BLo is selected to control the operation of writing data or reading data. More specifically, when signal evenBL is at logic level 1 and the signal oddBL is at logic level 0, and MOS transistor 442 is made electrically conductive to select the even numbered bit line BLe, which is then connected to the data storage circuit 440. When, on the other hand, the signal evenBL is at logic level 0 and oddBL is at logic level 1, transistor 444 is made electrically conductive to select the odd numbered bit line BLo, which is then connected to the data storage circuit 440. Note that the signal evenBL is applied to all of the n-channel MOS transistors for column selection connected through the even numbered bit lines; whereas the signal oddBL is applied to all the n-channel MOS transistors for column selection connected to the odd numbered bit lines.

Each data storage circuit 440 includes three binary data storage sections DS1, DS2 and DS3. Storage section DS1 is connected to the data input/output 312 by way of the internal data input/outlines line(s) and stores externally input data to be written or readout data to be externally output. Data storage section DS2 stores the detection outcome of a write verify operation for confirming the threshold value of a memory cell after a write operation. Data storage section DS3 temporarily stores the data of a memory cell at the time of writing it and/or at the time of reading it. In other embodiments, the data storage sections can also have other functions. In various embodiments, DS1, DS2, DS3 can be portions of a memory unit, one or more registers, or any other device that can store information. In one embodiment, DS1, DS2 and DS3 are each one bit. In other embodiments, one or more of DS1, DS2 and DS3 can store multiple bits. Circuits other than the circuit depicted in FIG. 9 can also be used to control bit lines.

Note that the FIG. 9 shows an even/odd bit line configuration. However, the present invention can be used with many different bit line configurations, such as a configuration where each bit line has its own sense amplifier and/or data storage. In some configurations suitable for implementing the present invention, all bit lines are programmed in one pass, rather than in odd and even passes. For example, see U.S. patent application Ser. No. 10/254,483, "Highly Compact Non-Volatile Memory and Method Thereof," filed on Sep. 24, 2002, incorporated herein by reference in its entirety.

Figure 10:
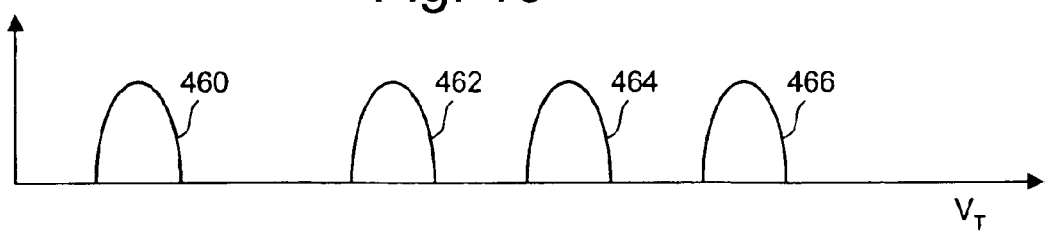
FIG. 10 depicts memory cell threshold distributions for multi-state memory cells.

FIG. 10 illustrates threshold voltage distributions for memory cells storing two bits of data (e.g. four data states). In one embodiment, distribution 460 represents a distribution of threshold voltages of cells that are in the erased state (e.g. storing "11"), having negative threshold voltage levels. Distribution 462 represents a distribution of threshold voltages of cells that are storing "10." Distribution 464 represents a distribution of threshold voltages of memory cells storing "00." Distribution 466 represents a distribution of threshold voltages of cells that are storing "01." In other embodiments, each of the distributions can correspond to different data states than described above. Additionally, the present invention can work with memory cells that store more than two bits.

In one implementation, a memory cell in the erased state (distribution 460) can be programmed to any of the program states (distributions 462, 464 or 466). In another embodiment, memory cells in the erased state are programmed according to a two-step methodology. In this two-step methodology, each of the bits stored in a data state correspond to different logical pages. That is, each bit stored in a memory cell has a different logical page address, pertaining to a lower logical page and an upper logical page. For example, in state "10," the "0" is stored for the lower logical page and the "1" is stored for the upper logical page. In a first programming step, the cell's threshold voltage level is set according to the bit to be programmed into the lower logical page. If that bit is a logic "1," the threshold voltage is not changed since it is in the appropriate state as a result of having been earlier erased. However, if the bit is to be programmed to a logic "0," the threshold level of the cell is increased to be within the threshold voltage distribution 462.

In the second programming step, the cell's threshold voltage level is set according to the bit being programmed into the upper logical page. If the upper logical page bit is to be logic "1," then no further programming occurs since the cell is in one of the states corresponding to the threshold voltage distribution 460 or 462, both of which carry an upper page bit of "1." If the upper logical page bit is to be logic "0" and the first step resulted in the cell remaining in the erased state corresponding to threshold 460, then the second step of the programming process includes raising the threshold voltage to be within threshold distribution 466. If the upper logical page bit is to be logic "0" and the cell had been programmed into the state corresponding to threshold distribution 462 as a result of the first programming step, then the second step of the programming process includes raising the threshold voltage to be within threshold voltage distribution 464. The two step process is just one example of a methodology for programming multi-state memory. Many other methodologies, including a one step process or more than two steps can be used. Although FIG. 8 shows four states (two bits), the present invention can also be used with other multi-state structures including those that include eight states, sixteen states, thirty-two states, and others.

Figure 11:
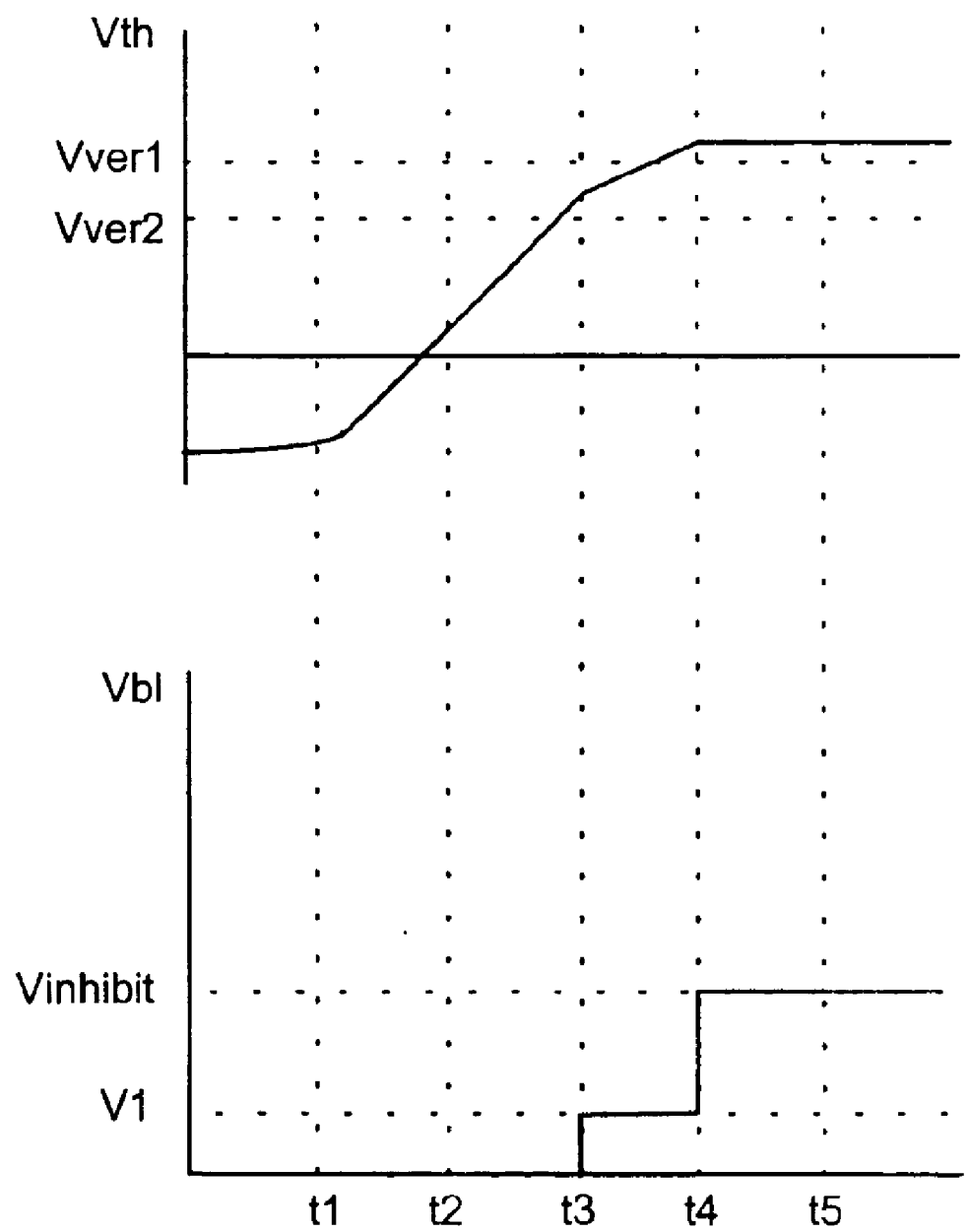
FIG. 11 depicts graphs of threshold voltage (Vth) versus time and bit line voltage (Vbl) versus time.

FIG. 11 explains the programming process according to one embodiment of the present invention. FIG. 11 shows graphs of threshold voltage (Vth) versus time and bit line voltage (Vbl) versus time. The horizontal access shows t1, t2, t3, t4 and t5. Each of these moments in time correspond to a verify procedure performed between program pulses. The process described in FIG. 11 can be used to program a memory cell into any of multiple states, or can be used to program a binary memory cell.

Figure 1:
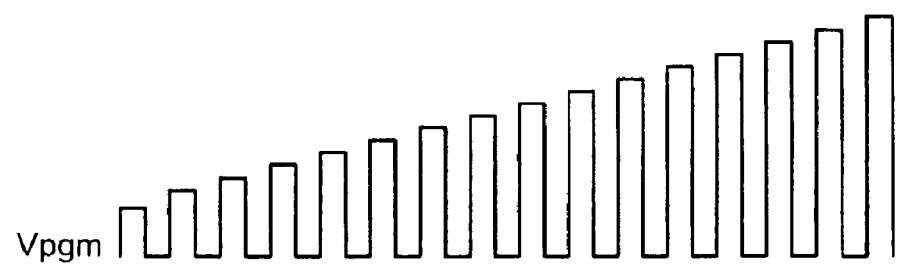
FIG. 1 depicts a program voltage signal.

As a set of programming pulses are applied to the memory cell, similar to the program pulses of FIG. 1, the threshold voltage of the memory cell will increase as depicted in FIG. 11 between time t1 and t2. In some embodiments, the initial threshold voltage, prior to programming and subsequent to erasing, will have a negative threshold voltage. When the threshold voltage of the memory cell reaches the lower intermediate threshold voltage verify point Vver2, the bit line voltage will be raised from 0 volts to intermediate voltage V1. Note that FIG. 11 shows that the threshold voltage becomes greater than Vver2 after t2 and prior to t3. At that time, t3, it will be determined that the threshold voltage of the memory cell is above Vver2. Upon determining that the threshold voltage is above Vver2, the bit line voltage is raised to intermediate voltage V1. In one embodiment, V1 is lower than the intermediate voltage used in the prior art. For example, some embodiments may use 0.4 volts or 0.5 volts for V1. The present invention contemplates that the memory cell will have its bit line at V1 for exactly one programming pulse. Subsequent to the one programming pulse, the bit line will be raised to the inhibit voltage (e.g. Vdd). Thus, upon the threshold voltage reaching Vver2, the program process will be slowed down for one programming pulse and then inhibited thereafter. By slowing down the programming process for the last pulse and, thereby, reducing the amount of shift of the threshold voltage for that last pulse, the programming process will achieve a tighter threshold voltage distribution. Additionally, a larger step size can be used. For example, many prior art processes use a step size for Vpgm of 0.2 volts. The present invention contemplates a step size of 0.4 volts.

Figure 2:
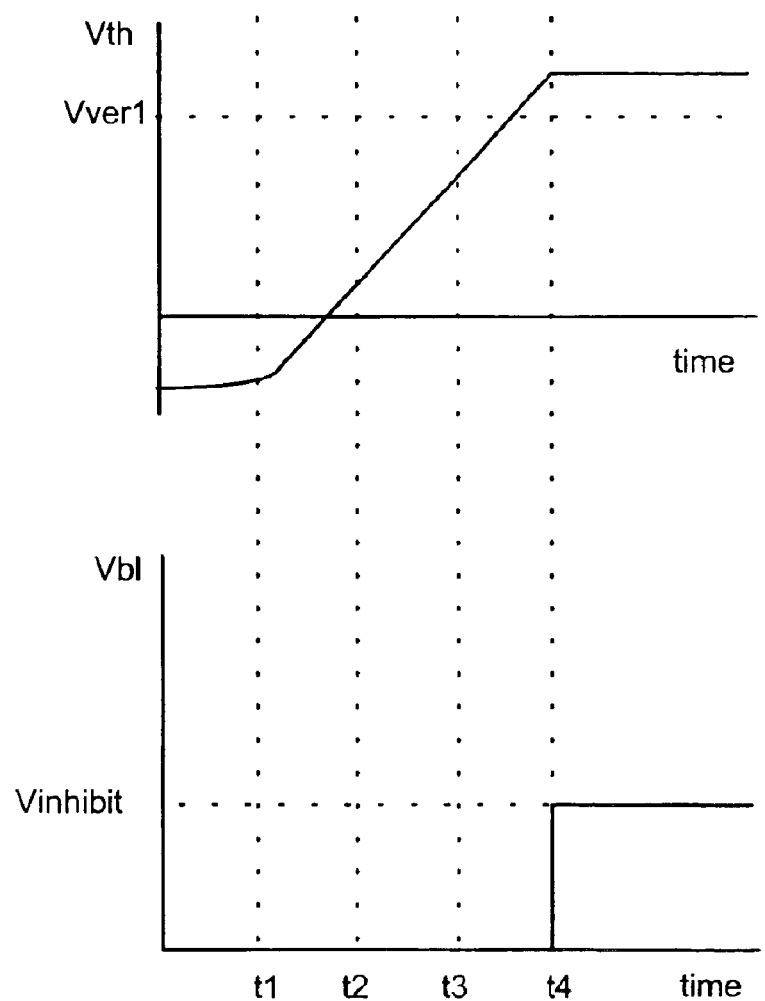
FIG. 2 depicts graphs of threshold voltage (Vth) versus time and bit line voltage (Vbl) versus time.

In some embodiments, the voltage V1 should be chosen in such a way that the threshold voltage shift of the memory cell during the next programming pulse is equal to half of the program voltage step size. That is, if the program step is 0.4 volts, V1 is chosen so that the shift in threshold voltage of the memory cell would be equal to 0.2 volts. The values of Vver1 and Vver2 are chosen in an appropriate way such that the shift of the threshold voltage of the memory cell should be at or higher than Vver1 (the target value) after one additional programming pulse following the threshold voltage reaching Vver2. Thus, in some embodiments, Vver2 should be separated from Vver1 by half the program voltage step size (e.g. 0.2 volts). The advantage of the above-described method, as compared to the process of FIG. 2, is that less programming pulses are needed, resulting in a shorter programming time.

Figure 12:
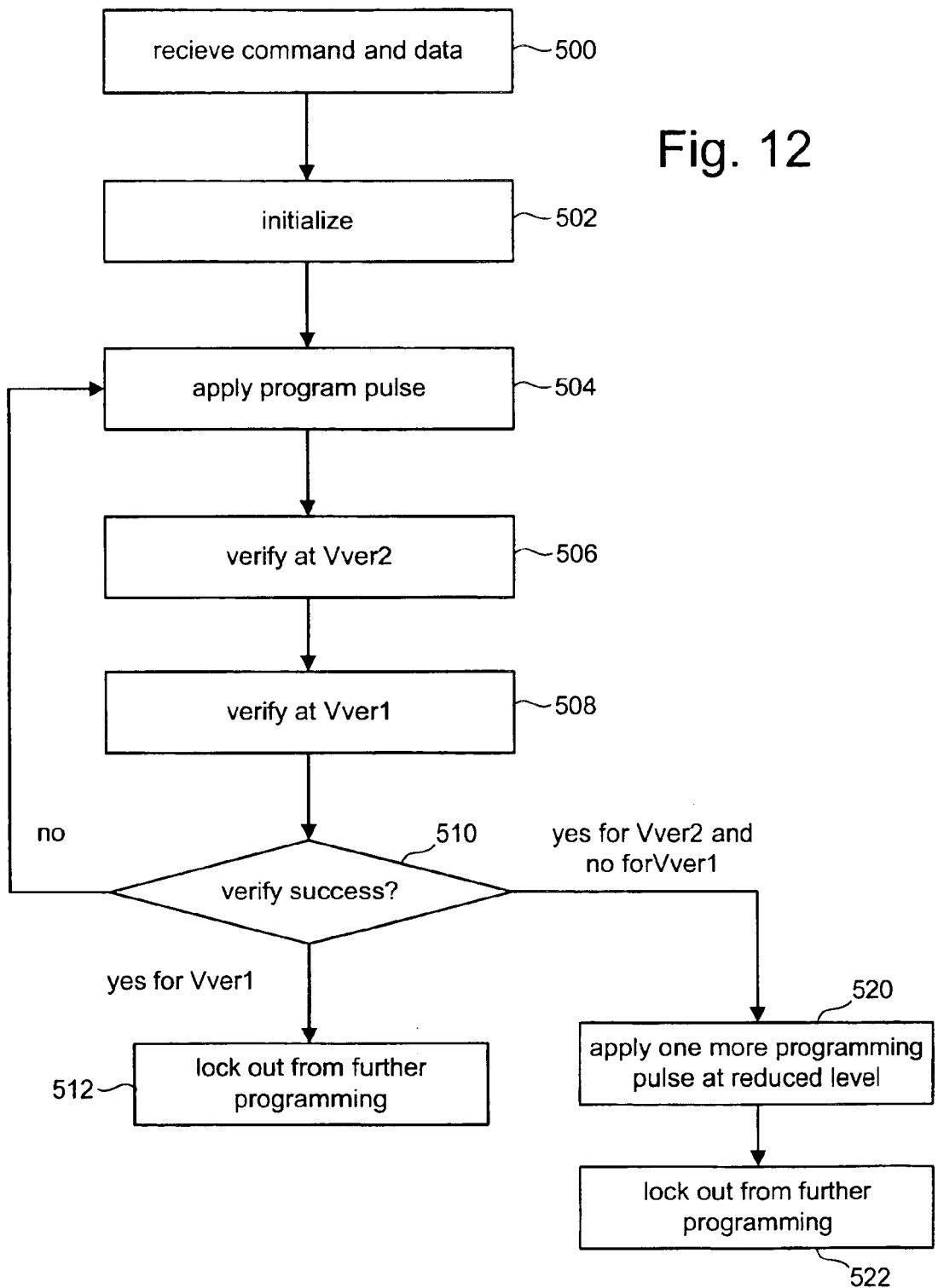
FIG. 12 is a flow chart describing a method for programming memory using concepts of the present invention.

FIG. 12 is a flow chart describing a general method for programming memory using the concepts described above with respect to FIG. 11. In step 500, the system will receive commands and data to program the memory. In step 502, initialization will be performed. For example, in some embodiments, memory cells will be erased prior to programming. Additionally, some memory cells that have been erased will be subjected to a soft programming process so that all memory cells that have been erased will have a threshold voltage within a narrow erased threshold voltage distribution. Additionally, status registers are initialized. In step 504, a programming pulse is applied. For example, the control gates of the transistors in the appropriate NAND chains have their control gates receiving a programming pulse. In step 506, a verify operation will be performed so that the memory cells will be tested to determine whether their threshold voltages have reached Vver2 (see FIG. 11). In step 508, a verify operation will be performed so that the memory cells will be tested to determine whether their threshold voltages have reached Vver1 (see FIG. 11). In a binary memory cell, there will be only one Vver1 and one Vver2. In a multi-state memory cell, each state will have its own Vver1 and Vver2. In some embodiments, there will be a set of verify operations for each state. Thus, in an eight-state memory cell, there will be seven sets of verify operations with each verify operation of the set having a verify procedure for Vver2 and a verify procedure for Vver1.

If the verify process of step 506 was successful and the verify process of step 508 was not successful (see step 510), then it is assumed that the threshold voltage of the memory cell is greater than Vver2 and less than Vver1. In that case, one more programming pulse is applied to the memory cell in step 520. However, this programming pulse is applied at a reduced level. For example, in one embodiment, the bit line of the memory is raised to intermediate voltage V1, as described above. In another embodiment, rather than raising the bit line voltage, the programming pulse can be shortened for that memory cell. One embodiment includes applying Vdd on the bit line at the start of the programming pulse. During the programming pulse, the bit line voltage will be reduced from Vdd to 0 volts to allow some programming. Typically the programming pulse is 8–10 microseconds. In the embodiment, the reduced programming pulse is 5 microseconds. Note that step 520 only includes applying one pulse to the memory cell being programmed. After that one pulse is applied, that memory cell will be locked out from further programming at step 522.

If the verify process of step 508 was successful (see step 510), then it is assumed that the threshold voltage of the memory cell is greater than Vver1 and, in step 512, the memory cell will be locked out from further programming.

If the verify process of step 506 was unsuccessful and the verify process of step 508 was not successful (see step 510), then it is assumed that the threshold voltage of the memory cell is less than Vver2. In that case, the process loops back to step 504 in order to apply the next program pulse.

Figure 13:
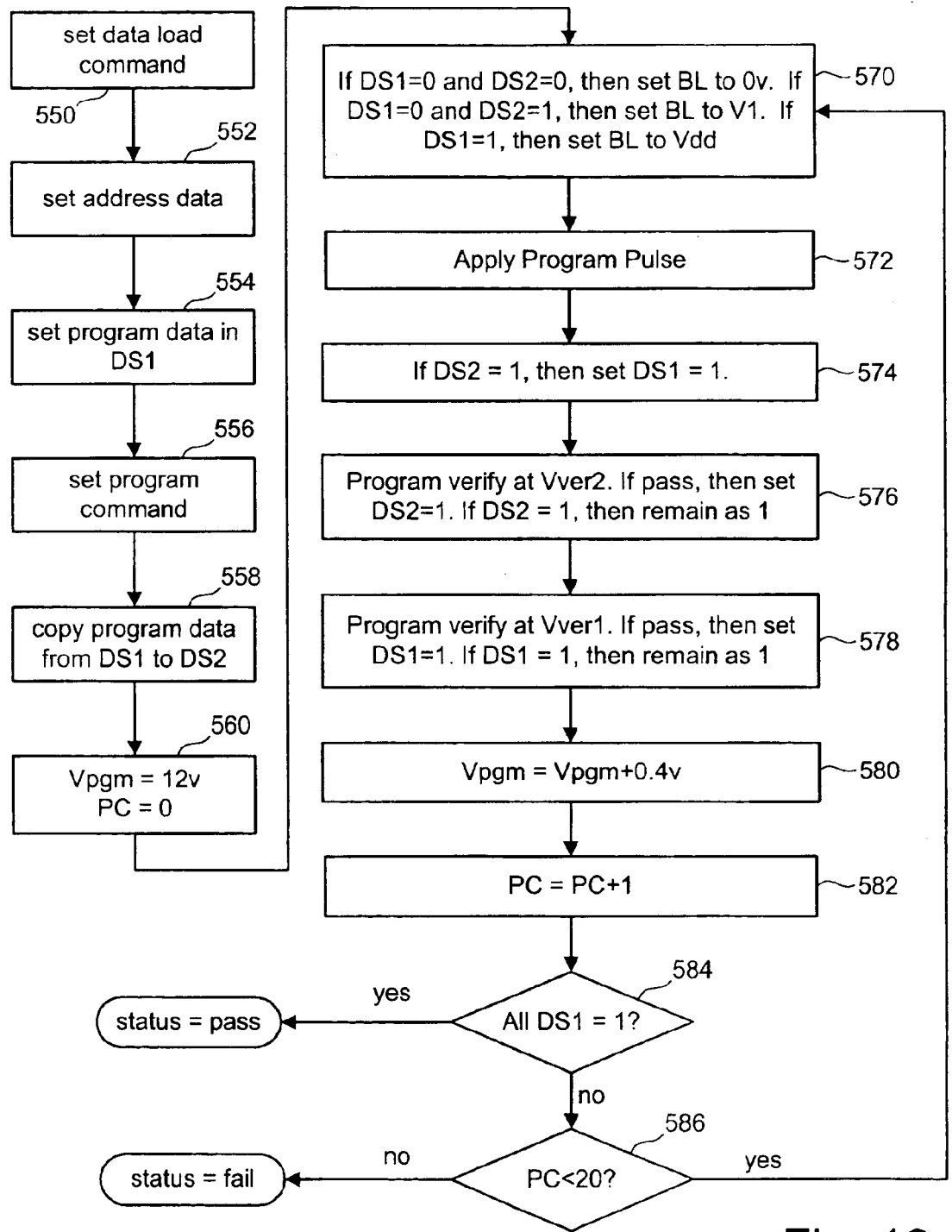
FIG. 13 is a flow chart describing a method for programming according to various embodiments of the present invention.

As described above, a multi-state memory cell can have various configurations. In one configuration, the multi-state memory cell will allow the erased state to be programmed to any programmed state. For example, looking at FIG. 10, the memory cell in state 460 can be directly programmed to either state 462, 464 or 466. In another embodiment, the memory cells can use multiple logical pages and be programmed according to the two-step programming process described above. FIG. 13 is a flow chart describing one example of a process of programming the lower logical page of a multiple logical page memory cell, as described above. Other embodiments with more bits, more pages, different state assignments, etc. are also within the scope of the present invention. Various modifications to the process of FIG. 13 can be made to accommodate other variations on the threshold state assignments and program methodology. The process of FIG. 13 can also be used with a binary memory cell.

In step 550 of FIG. 13, the operation starts by receiving a data input command from the host and placing that data input command in the state machine. In step 552, address data is received from the host and stored in the state machine in order to select the page to be used for the write operation. In step 554, the data to be written is received and stored in DS1. In step 556, a write command is received from the host and that write command is placed in the state machine. In one embodiment, after the write command is stored in the state machine, the operation of the subsequent steps are automatically started by the state machine. In step 558, the data from DS1 is copied to DS2. In step 560, the initial values of the program voltage Vpgm is set (e.g. 12 volts; however, other values can also be used). Additionally, the program counter (PC) is initialized to 0.

In one embodiment, the erased state corresponds to logical data one and the program state corresponds to logical date as 0. Thus, when loading data into DS1 and DS2, if a 0 is being loaded into those registers, then the memory cell is going to be programmed. If a logical data one is loaded into DS1 and DS2, then the memory cell need not be programmed because it is already in an erased state. In the embodiment of the multi-state memory cell that uses two logical pages in a two-step programming process, if the lower state is to be changed from state 460 to state 462, then a 0 is loaded into DS1 and DS2. If the memory cell is to stay in state 460, then a 1 is loaded into DS1 and DS2.

In step 570, it is determined whether DS1 is equal to 0 and DS2 is equal to 0. If so, then the bit line is set to 0 volts. This is the situation where the memory cell is to be programmed to the next state and the threshold voltage is below Vver2.

If DS1 is equal to 0 and DS2 is equal to 1, then the bit line is set to V1, the intermediate bit line voltage. This is the case where the threshold voltage is greater than Vver2 and less than Vver1.

If DS1 is equal to 1, then it is assumed that the threshold voltage of the memory cell is above Vver1. In that case, the bit line is set to Vdd in order to inhibit further programming.

In step 572, the next program pulse is applied to the control gate of the memory cell. In step 574, it is determined whether DS2 is equal to 1. If so, then DS1 is also set to 1. Step 574 is performed so that after DS2 is set to 1 (because the threshold voltage of the memory cell is above Vver2, but below Vver1), the memory cell will only be programmed for one more programming pulse. In step 576, the memory cell is subject to a verification process for Vver2. If the verification process is successful (because the threshold voltage is greater than or equal to Vver2), then DS2 is set to 1. If DS2 was already at 1, then it remains at 1. In step 578, the memory cell is subjected to a verification process for Vver1. If the verification process passes (because the threshold voltage has reached Vver1), then DS1 is set to 1. If DS1 was already at 1, then it remains at 1. In step 580, the program voltage is increased by the step size. In one embodiment, the step size is 0.4 volts. Therefore, the next programming pulse will be 0.4 volts higher than the previous pulse. In another embodiment, the step size is 0.2 v or other values. In step 582, the program counter is incremented by 1. In step 584, it is determined whether all of the memory cells being programmed have their DS1 register equal to 1. If so, the programming process has completed successfully. If not, the programming process continues. In step 586, it is determined whether the program counter is less than 20. If not, the programming process has failed. If the program counter is less than 20, then the process loops back to step 570.

In some embodiments, the program counter is not necessarily compared to 20. It can be as low as 4 or 5 for two level operation. For multi-level it can be in the order of 12 for the lower page and 16 or so for the upper page. These values depend on the step size that is used as well. In some embodiments, if the program counter reaches the maximum, the programming process does not necessarily fail. After the program counter reaches the maximum value, the systems checks how many memory cells in the page have not reached the verify level. If that number of cells is less than a certain value, say 1 or less, than the programming process may still be considered successful since error correction (e.g. ECC) can be used to correct that 1 bit. Furthermore, in many cases, a cell that has not passed the verify voltage, may still have a high enough threshold voltage to pass a normal read operation that is carried out at a lower gate voltage.

Figure 14:
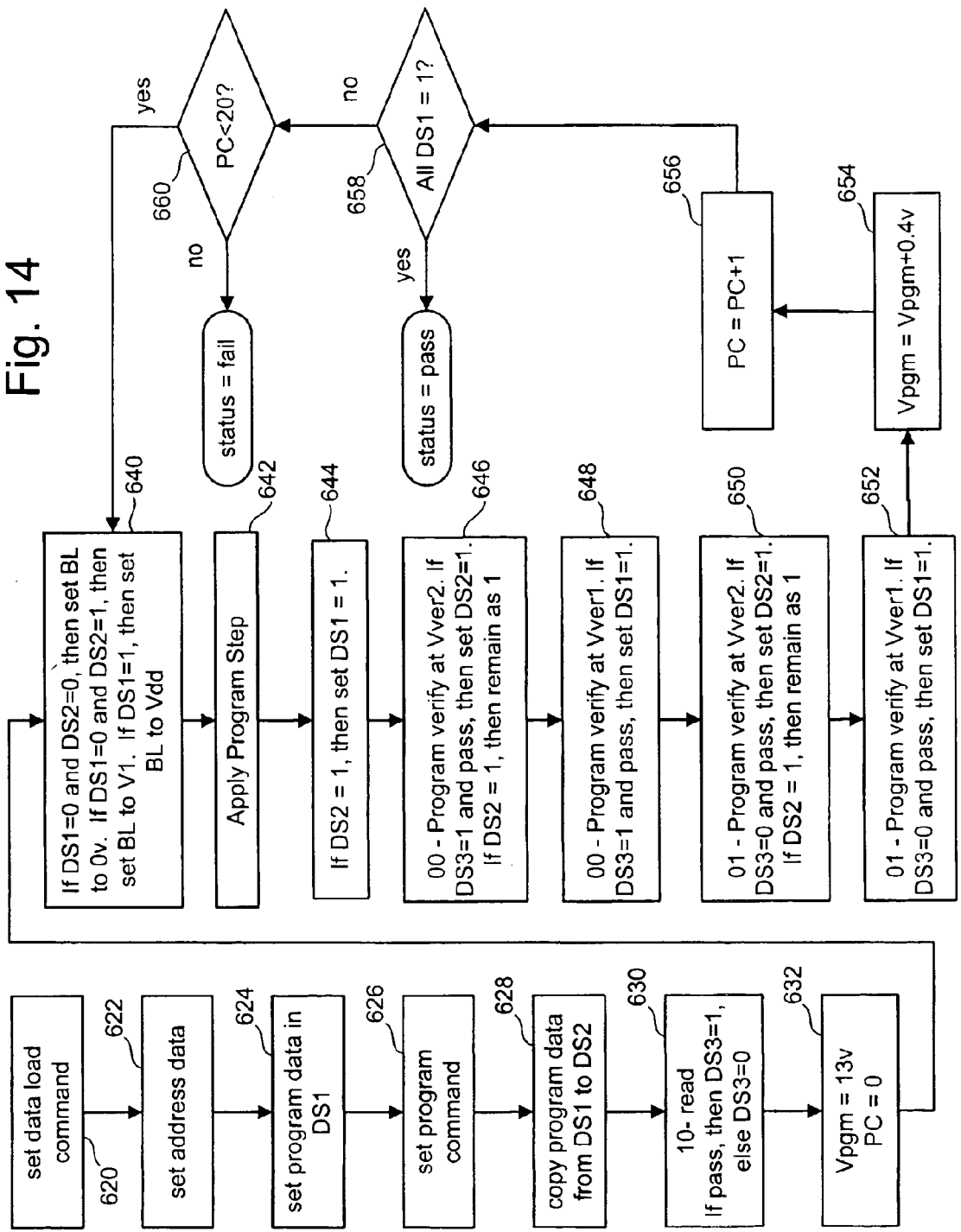
FIG. 14 is a flow chart describing is a flow chart describing a method for programming a logical page according to various embodiments of the present invention.

As discussed above, in one embodiment of the multi-state memory cell that uses the two logical pages and the two-step programming process, state 460 is equal to 11, state 462 is equal to 10, state 464 is 00 and state 466 is 01. In this embodiment, the process of FIG. 13 is used for programming cells from state 11 to state 10. The process of FIG. 14 is for programming memory cells from either state 11 to state 01 or from state 10 to state 00. That is, FIG. 14 is a flow chart describing the control algorithm for one embodiment of writing upper page data to the memory cell.

In step 620 of FIG. 14, operation starts when receiving the data input command from the host and placing that data input command in the state machine. In step 622, address data is received from the host and placed in the state machine. In step 624, data to be written is received and stored in DS1. In step 626, a write command is received from the host and placed in the state machine, which (in some embodiments) automatically triggers the start of the subsequent process. In step 628, the program data is copied from DS1 to DS2. In step 630, a state 10 read operation is performed using a read compare point that is in between states 11 and 10 to determine whether the memory cell is in state 11 or 10. If it is determined that the memory cell is in state 10, then the DS3 register for that memory cell is set to 1; otherwise, the DS3 register is set to 0. In step 632, the program voltage is initially set to a value in the 16V–18V range (determined based on testing); however, other initial voltages can also be used. Additionally, the program counter is initially set to 0.

In step 640, it is determined whether the DS1 register and the DS2 register are both set to 0. If so, it is assumed that the threshold voltage of the memory cell being programmed is below Vver2 for the appropriate state being programmed and, therefore, the bit line is set to 0 volts.

If DS1 is set to 0 and DS2 is set to 1, then it is assumed that the threshold voltage of the memory cell is above Vver2 and below Vver1; therefore, the bit line is set to intermediate voltage of V1.

If DS1 is set to 1, then it is assumed that the threshold voltage of the memory cell is above Vver1; therefore, the bit line voltage is set to Vdd in order to inhibit any further programming. In step 642, the next programming pulse is applied. In step 644, it is determined whether the DS2 register is set to 1. If so, then the DS1 register is also set to 1. Step 644 is used to make sure that after the memory cell reaches Vver2, only one more pulse is used to program the memory cell. In step 646, a verification process is performed for Vver2 of state 00. If DS3 is equal to 1 and the verification process passes, then the DS2 register is set to 1. In step 648, a program verification process is performed for Vver1 for state 00. If DS3 is set to 1 and the verification process passes, then the DS1 register is set to 1. In step 650, a verification process is performed for Vver2 of state 01. If the DS3 register is set to 0 and the verification process passes, then the DS1 register is set to 1. In step 652, a verification process is performed for Vver1 for state 01. If the DS3 register is set to 0 and the verification process passes, then the DS1 register is set to 1. In step 654, the program voltage is increased by the step size.

In some embodiments, step 650 is not performed. That is, the system only checks for Vver1 for the highest programmed state (e.g. state 01) in order to save programming time. In some implementations, a wider threshold voltage distribution can be tolerated for the highest programmed state (e.g. state 01).

In step 656, the program counter is increased by 1. In step 658, it is determined whether all of the memory cells being programmed have their DS1 register set to 1. If so, then the program process has completed successfully. Otherwise, in step 660, it is determined whether the program counter is less than 20. If not, then the program process has failed. If the program counter is less than 20, then the process loops back to step 640.

Note that in the above-described embodiment, a bit line intermediate voltage is chosen in such a way that the threshold shift during the next programming pulse is equal to half of the step size. In other embodiments, the shift may vary slightly in either direction. The difference between Vver1 and Vver2 is chosen in such a way that a cell that just passes the Vver2 level at time $t_n$ has a threshold voltage just above (or in some cases close to) Vver1 at $t_{n+1}$. The intermediate bit line voltage V1 is only applied to cells that have a threshold voltage (at a certain time point $t_n$) that is higher than Vver2, but less than Vver1, and is only applied for one programming pulse. After that one programming pulse, further programming is inhibited. Thus, during a manufacturing process when creating an array of non-volatile storage elements and memory system according to FIG. 7, the final verify threshold (e.g. Vver1) for a particular state, or for all states, is set and the intermediate verify threshold(s) (e.g. Vver2) for the relevant various states are set so that the memory cells will reach or almost reach the final verify threshold one programming operation (e.g. one programming pulse) after the memory cell reaches the intermediate verify threshold. It is possible that some of the memory cells may not reach the Vver1 level. Pursuant to the above-described process, no additional programming pulses will be used to program those memory cells that did not reach the Vver1 level. Reasons for not reaching the Vver1 level may be due to read noise during the Vver1 and/or Vver2 step or due to a threshold voltage shift that is smaller than expected during the last programming pulse. Thus, in some cases, a particular memory cell using the techniques described above may have it threshold voltage just below Vver1.

The embodiments described above contemplate two verification points: a final verification point and an intermediate verification point. Another embodiment of the present invention uses three verify levels. In other embodiments, more than three verify levels can also be used.

Figure 15:
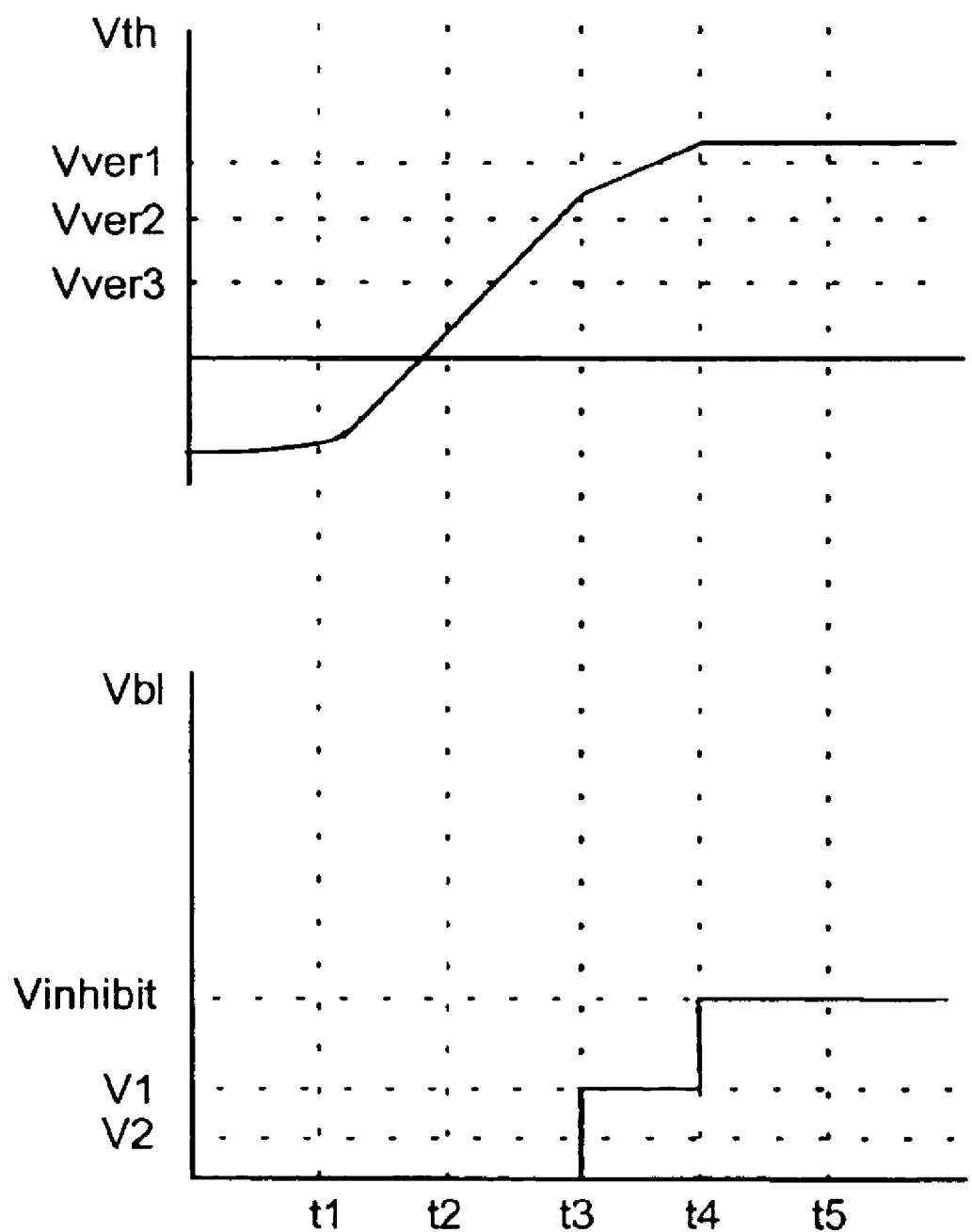
FIG. 15 depicts graphs of threshold voltage (Vth) versus time and bit line voltage (Vbl) versus time.
Figure 16:
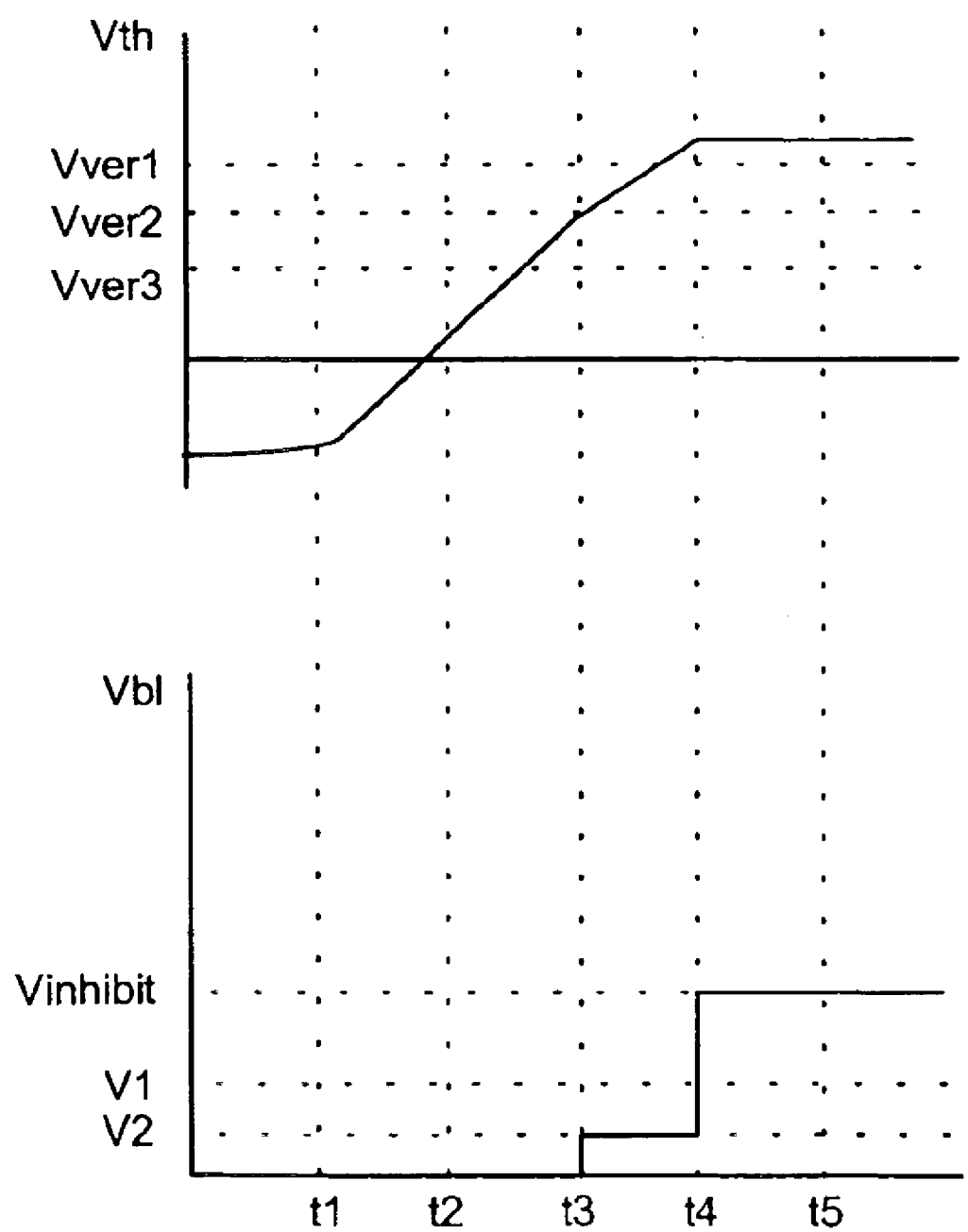
FIG. 16 depicts graphs of threshold voltage (Vth) versus time and bit line voltage (Vbl) versus time.

FIGS. 15 and 16 describe an embodiment that uses three verification levels. Both FIGS. 15 and 16 include graphs of threshold voltage (Vth) versus time and bit line voltage (Vbl) versus time. In the embodiment with three verify levels, memory cells that have a threshold voltage higher than the target voltage Vver1 during a verify operation are inhibited completely by raising the bit line voltage to Vinhibit. Memory cells that have a threshold voltage in between Vver1 and Vver2 are slowed down by applying an intermediate bit line voltage of V1 during the subsequent programming step and are fully inhibited after that so that only one program impulse with bit line at V1 is performed. The values of V1 and Vver2 should be set in such a way that the cell that passes Vver2 at $t_n$ will reach or almost reach Vver1 at $t_{n+1}$. Memory cells that have their threshold voltage in between Vver3 and Vver2 during a verify operation are slowed down by applying an intermediate bit line voltage V2 during the subsequent programming step and are fully inhibited after that so that only one programming pulse with the bit line at V2 is performed. The values of V2 and Vver3 should be set in such a way that the cell that just passes Vver3 level at $t_n$ will just reach or almost reach the Vver1 level at $t_{n+1}$. In this embodiment, V2 and V1 are chosen in such a way that the threshold voltage shift on the next programming pulse is equal to one-third of the program step if the memory cell has just passed Vver2 and two-thirds of the program step if the memory step has just passed Vver3.

FIG. 15 shows a memory cell which is programmed such that the threshold voltage of the memory cell becomes higher than Vver2 in between t2 and t3. The threshold voltage also increases past Vver3 in between t2 and t3. Thus, when a verification process is performed at t3, the memory cell is determined to be above Vver2 and below Vver1. Therefore, the bit line voltage is raised to the intermediate voltage V1 for one programming pulse. After the one programming pulse, the bit line voltage is raised to Vinhibit and the memory cell is locked out from further programming.

The example of FIG. 16 shows a memory cell whose threshold voltage crosses Vver3 in between t2 and t3. When a verification process is performed at t3, it is determined that the threshold voltage of the memory cell is above Vver3 and below Vver2; therefore, the bit line voltage of the memory cell is raised to the intermediate voltage of V2 for one pulse. After the one programming pulse, the bit line voltage is raised to Vinhibit.

With more verify levels, more verify operations are needed. If more verify operations are performed, the programming process takes longer.

Figure 3:
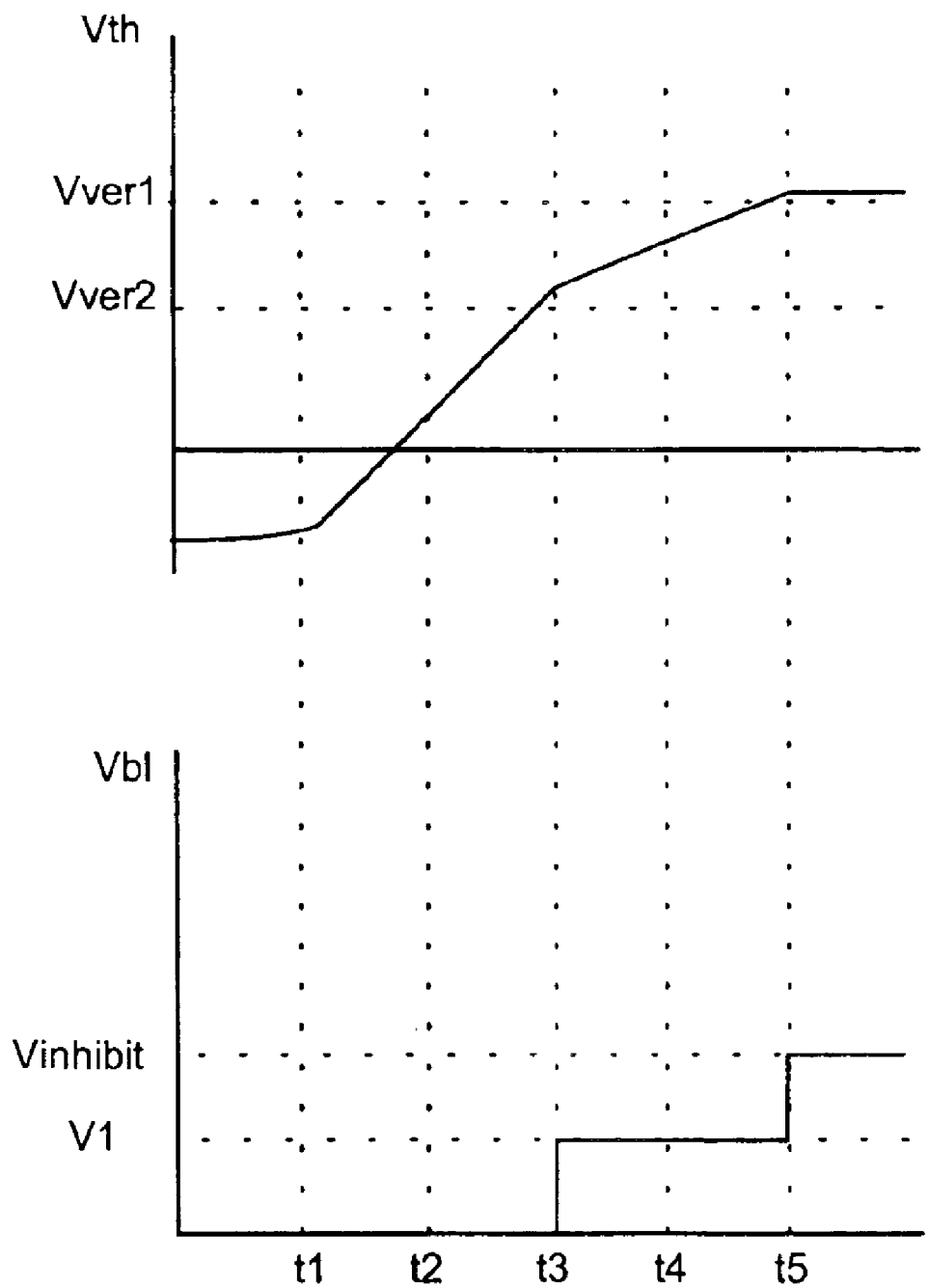
FIG. 3 depicts graphs of threshold voltage (Vth) versus time and bit line voltage (Vbl) versus time.

One advantage of the present invention when compared to the process of FIG. 3 is that no additional programming pulses are required after the one program pulse subsequent to raising the bit line voltage. Therefore, the programming time is shorter.

In comparison with the write processes of FIG. 2, a much larger step size can be used while maintaining the same threshold voltage distribution since the last step of the programming process is effectively half the size. Thus, the number of required programming pulses can be reduced (e.g., in some cases to almost 50%).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for programming non-volatile memory, comprising:
    performing one or more programming operations on a non-volatile storage element;
    determining that said non-volatile storage element has reached an intermediate verify threshold, said intermediate verify threshold is different than a final verify threshold;
    performing only one additional programming operation at a reduced level on said non-volatile storage element in response to said step of determining; and
    inhibiting programming of said non-volatile storage element after performing said only one additional programming operation regardless of change in threshold voltage for said non-volatile storage element in response to said one additional programming operation.

2. A method according to claim 1, wherein:
    said one or more programming operations include applying programming pulses which increase in magnitude at a step size; and
    said one additional programming operation intentionally changes a threshold voltage of said non-volatile storage element by an amount approximately half of said step size.

3. A method according to claim 1, wherein:
    said intermediate verify threshold is below said final verify threshold by an amount such that after said non-volatile storage element has reached said intermediate verify threshold said one additional programming operation will cause said non-volatile storage element to reach or almost reach said final verify threshold.

4. A method according to claim 1, wherein:
    said one or more programming operations are performed while a bit line voltage for said non-volatile storage element is at a programming level;
    said inhibiting programming of said non-volatile storage element is performed while said bit line voltage for said non-volatile storage element is at an inhibit level; and
    said one additional programming operation is performed while said bit line voltage for said non-volatile storage element is at an intermediate level between said programming level and said inhibit level, said bit line voltage for said non-volatile storage element is at said intermediate level for exactly one programming operation.

5. A method according to claim 1, wherein:
said one additional programming operation is performed at said reduced level by raising a bit line voltage for said non-volatile storage element.

6. A method according to claim 1, wherein:
said one or more programming operations include applying programming pulses; and
said one additional programming operation is performed at said reduced level by reducing the width of a programming pulse for said one additional programming operation.

7. A method according to claim 1, wherein:
said one or more programming operations include applying programming pulses;
said step of performing only one additional programming operation includes applying one programming pulse; and
said step of inhibiting is required to be performed after applying said one programming pulse.

8. A method for programming non-volatile memory, comprising:
performing one or more programming operations on non-volatile storage elements;
determining which of said non-volatile storage element reached an intermediate verify threshold but have not reached a final verify threshold;
performing one additional programming operation at a reduced level on said non-volatile storage elements that have reached said intermediate verify threshold but have not reached said final verify threshold;
for said non-volatile storage elements that have reached said intermediate verify threshold but have not reached said final verify threshold, automatically inhibiting programming after said one additional programming operation; and
continuing programming for non-volatile storage elements that have not reached said intermediate verify threshold.

9. A method according to claim 8, wherein:
said one or more programming operations include applying programming pulses which increase in magnitude at a step size; and
for said non-volatile storage elements that have reached said intermediate verify threshold but have not reached said final verify threshold, said one additional programming operation intentionally changes threshold voltages by an amount approximately half of said step size.

10. A method according to claim 8, wherein:
said intermediate verify threshold is below said final verify threshold by an amount such that for non-volatile storage elements that have reached said intermediate verify threshold said one additional programming operation will cause said non-volatile storage element to reach or almost reach said final verify threshold.

11. A method according to claim 8, wherein:
said one or more programming operations are performed while bit line voltages for said non-volatile storage elements are at a programming level range;
said inhibiting programming is performed while bit line voltages are at an inhibit level; and
said one additional programming operation is performed while bit line voltages are at an intermediate level between said programming level and said inhibit level.

12. A method according to claim 11, wherein:
said one or more programming operations include applying programming pulses;
said step of performing only one additional programming operation includes applying one programming pulse; and
said step of inhibiting is required to be performed after applying said one programming pulse.

13. A method according to claim 8, wherein:
said one or more programming operations include applying programming pulses;
said step of performing only one additional programming operation includes applying one programming pulse; and
said step of inhibiting is required to be performed after applying said one programming pulse.

14. A method according to claim 8, wherein:
said one or more programming operations include applying programming pulses; and
said one additional programming operation is performed at said reduced level by reducing a width of a programming pulse for said one additional programming operation.

15. A non-volatile storage system, comprising:
an array of non-volatile storage elements; and
a control circuit in communication with said non-volatile storage elements, said control circuit causes said non-volatile storage elements to perform one or more programming operations, determines which of said non-volatile storage element reached an intermediate verify threshold but have not reached a final verify threshold, causes one additional programming operation at a reduced level to be performed on said non-volatile storage elements that have reached said intermediate verify threshold but have not reached said final verify threshold, inhibits programming for said non-volatile storage elements that have reached said intermediate verify threshold after said one additional programming operation and continues programming for non-volatile storage elements that have not reached said intermediate verify threshold, said control circuit is required to inhibit programming for said non-volatile storage elements that have reached said intermediate verify threshold after said one additional programming operation and prior to additional programming operations.

16. A non-volatile storage system according to claim 15, wherein:
said control circuit includes a controller.

17. A non-volatile storage system according to claim 15, wherein:
said control circuit includes a state machine.

18. A non-volatile storage system according to claim 15, wherein:
said control circuit includes a set of sense amplification circuits, a controller and a state machine.

19. A non-volatile storage system according to claim 15, wherein:
said one or more programming operations include programming pulses which increase in magnitude at a step size; and
for said non-volatile storage elements that have reached said intermediate verify threshold but have not reached said final verify threshold, said one additional programming operation intentionally changes threshold voltages by an amount approximately half of said step size.

20. A non-volatile storage system according to claim 15, wherein:

said one or more programming operations are performed while bit line voltages for said non-volatile storage elements are at a programming level range;

said inhibiting programming is performed while bit line voltages are at an inhibit level range; and said one additional programming operation is performed while bit line voltages are at an intermediate level range between said programming level range and said inhibit level range.

21. A non-volatile storage system according to claim 15, wherein:

said one or more programming operations include applying programming pulses; and said one additional programming operation includes applying one programming pulse.

22. A method for programming non-volatile memory, comprising:

performing programming operations on a non-volatile storage element, said programming operations include an increasing program voltage, said increasing program voltage has an increment size;

determining that said non-volatile storage element has reached a particular intermediate verify threshold of a set of one or more intermediate verify thresholds;

performing one additional programming operation on said non-volatile storage element in response to said step of determining, said one additional programming operation changes a threshold voltage of said non-volatile storage element by a fraction of said increment size, wherein size of said fraction depends on which of said intermediate verify thresholds had been determined to be reached; and inhibiting programming of said non-volatile storage element after performing said one additional programming operation, said step of inhibiting is required to be performed after said one additional programming operation and prior to other additional programming operations.

23. A method according to claim 22, wherein:

said fraction of said increment size is half of said increment size and said set of one or more intermediate verify thresholds includes one intermediate verify threshold.

24. A method according to claim 22, wherein:

said fraction of said increment size is one third of said increment size; and said set of intermediate verify thresholds includes two intermediate verify thresholds.

25. A method according to claim 22, wherein:

said fraction of said increment size is two thirds of said increment size; and said set of intermediate verify thresholds includes two intermediate verify thresholds.

26. A method according to claim 22, wherein:

said set of intermediate verify thresholds includes three or more intermediate verify thresholds.

27. A method according to claim 22, wherein:

said programming operations are performed while a bit line voltage for said non-volatile storage element is at a programming level;

said inhibiting programming is performed while said bit line voltage is at an inhibit level; and said one additional programming operation is performed while said bit line voltage is at an intermediate level between said programming level and said inhibit level.

28. A method according to claim 22, wherein:

said one or more programming operations include applying programming pulses;

said one additional programming operation includes applying one programming pulse; and said inhibiting is required to be performed after applying said one programming pulse.

29. A non-volatile storage system, comprising:

an array of non-volatile storage elements;

a control circuit in communication with said non-volatile storage elements, said control circuit causes said non-volatile storage elements to perform one or more programming operations, determines which of said non-volatile storage element reached an intermediate verify threshold but have not reached a final verify threshold, causes one additional programming operation at a reduced level to be performed on said non-volatile storage elements that have reached said intermediate verify threshold but have not reached said final verify threshold, inhibits programming for said non-volatile storage elements that have reached said intermediate verify threshold automatically after said one additional programming operation; and wherein said one or more programming operations include an increasing program voltage, said increasing program voltage has an increment size, said one additional programming operation changes threshold voltages by a fraction of said increment size based on said particular intermediate verify threshold.

30. A method according to claim 29, wherein:

said one or more programming operations are performed while bit line voltages for said non-volatile storage elements are at a programming level range;

said inhibiting programming is performed while said bit line voltages are at an inhibit level range; and said one additional programming operation is performed while said bit line voltages are at an intermediate level range between said programming level range and said inhibit level range.

31. A method according to claim 29, wherein:

said one or more programming operations include applying programming pulses;

said one additional programming operation includes applying one programming pulse; and said inhibiting is required to be performed after applying said one programming pulse.

32. A method for programming non-volatile memory, comprising:

performing one or more programming operations on a non-volatile storage element;

determining that said non-volatile storage element has reached an intermediate verify threshold; and performing exactly one additional programming operation on said non-volatile storage element in response to said step of determining, said intermediate verify threshold is situated with respect to a final verify threshold such that said one additional programming operation is intended to cause said non-volatile storage element to reach or almost reach said final verify threshold.

33. A method for creating a non-volatile memory system, comprising:

creating an array of non-volatile storage elements;

setting a final verify threshold for a programming process; and setting an intermediate verify threshold for said programming process so that after a set of one or more non-volatile storage elements reach said intermediate verify threshold one programming operation will cause said set of one or more non-volatile storage elements to reach or almost reach said final verify threshold.

34. A method according to claim 33, wherein:

said programming process includes a set of programming operations;

each programming operation includes an application of a programming pulse so that said programming process includes a set of programming pulses increasing in magnitude by a step size; and said final verify threshold differs from said intermediate verify threshold by a fraction of said step size.

35. A method according to claim 33, wherein:

said programming process includes a set of programming operations;

each programming operation includes an application of a programming pulse so that said programming process includes a set of programming pulses increasing in magnitude by a step size; and said final verify threshold differs from said intermediate verify threshold by half of said step size.

\* \* \* \* \*